United States Patent
Liu et al.

(10) Patent No.: US 11,848,375 B2
(45) Date of Patent: Dec. 19, 2023

(54) IGBT CHIP HAVING FOLDED COMPOSITE GATE STRUCTURE

(71) Applicant: ZHUZHOU CRRC TIMES ELECTRIC CO., LTD, Hunan (CN)

(72) Inventors: Guoyou Liu, Hunan (CN); Chunlin Zhu, Hunan (CN); Liheng Zhu, Hunan (CN)

(73) Assignee: ZHUZHOU CRRC TIMES ELECTRIC CO., LTD, Zhuzhou (CN)

( * ) Notice: Subject to any disclaimer, the term of this patent is extended or adjusted under 35 U.S.C. 154(b) by 0 days.

(21) Appl. No.: 16/969,591

(22) PCT Filed: Sep. 18, 2018

(86) PCT No.: PCT/CN2018/106111
§ 371 (c)(1),
(2) Date: Aug. 13, 2020

(87) PCT Pub. No.: WO2019/157817
PCT Pub. Date: Aug. 22, 2019

(65) Prior Publication Data
US 2021/0013330 A1 Jan. 14, 2021

(30) Foreign Application Priority Data
Feb. 13, 2018 (CN) .......................... 201810148664.0

(51) Int. Cl.
*H01L 29/739* (2006.01)
*H01L 29/423* (2006.01)
(Continued)

(52) U.S. Cl.
CPC ...... *H01L 29/7396* (2013.01); *H01L 29/0696* (2013.01); *H01L 29/4236* (2013.01);
(Continued)

(58) Field of Classification Search
CPC .......... H01L 29/66734; H01L 29/7813; H01L 29/66348; H01L 29/7397; H01L 29/42356;
(Continued)

(56) References Cited

U.S. PATENT DOCUMENTS

| | | | |
|---|---|---|---|
| 6,380,586 B1 * | 4/2002 | Yoshikawa | H01L 29/7397 257/330 |
| 8,748,976 B1 * | 6/2014 | Kocon | H01L 29/66734 257/330 |

(Continued)

FOREIGN PATENT DOCUMENTS

WO    WO-2014178262 A1 * 11/2014 ........... H01L 29/165

OTHER PUBLICATIONS

International Search Report of PCT Patent Application No. PCT/CN2018/106111 dated Nov. 5, 2018.

*Primary Examiner* — Yu Chen

(57) ABSTRACT

An IGBT chip having a Γ-shape mixed gate structure includes a plurality of mixed gate units. Each of the mixed gate units includes a gate region and two active regions located at two sides of the gate region. The gate region includes a trench gate and a planar gate that is located on a surface of the gate region, and the planar gate is connected with the trench gate and formed a Γ-shape mixed structure. In this way, the IGBT chip can have a significantly improved chip density, while retaining features of low power consumption and high current density of the trench gate and a feature of a wide safe operating area of the planar gate.

12 Claims, 4 Drawing Sheets

(51) Int. Cl.
    *H01L 29/06*     (2006.01)
    *H01L 29/66*     (2006.01)
    *H01L 29/417*     (2006.01)

(52) U.S. Cl.
    CPC .. *H01L 29/42356* (2013.01); *H01L 29/42376* (2013.01); *H01L 29/66348* (2013.01); *H01L 29/7397* (2013.01); *H01L 29/41766* (2013.01)

(58) Field of Classification Search
    CPC ........... H01L 29/4236; H01L 29/42376; H01L 29/407; H01L 29/0696; H01L 29/4238
    See application file for complete search history.

(56) References Cited

U.S. PATENT DOCUMENTS

| | | |
|---|---|---|
| 2009/0008674 A1 | 1/2009 | Udrea |
| 2014/0264433 A1 | 9/2014 | Hu et al. |
| 2015/0162328 A1* | 6/2015 | Wang .................. H01L 29/7803 257/334 |
| 2017/0222002 A1* | 8/2017 | Chen .................. H01L 29/0856 |
| 2021/0257460 A1* | 8/2021 | Rahimo .............. H01L 29/7395 |

\* cited by examiner

IGBT CHIP HAVING FOLDED COMPOSITE GATE STRUCTURE

CROSS-REFERENCE TO RELATED APPLICATIONS

This application claims the priority of Chinese patent application CN201810148664.0, entitled "IGBT chip having Γ-shape mixed gate structure" and filed on Feb. 13, 2018, the entirety of which is incorporated herein by reference.

FIELD OF THE INVENTION

The present disclosure relates to the technical field of semiconductor devices, and in particular, to an IGBT chip having a Γ-shape mixed gate structure.

BACKGROUND OF THE INVENTION

The IGBT (insulated gate bipolar transistor) has been widely used in fields such as rail transit, smart grid, industrial frequency conversion and new energy development since it was invented in 1980's due to the combination of both advantages of bipolar junction transistor (BJT) and metal-oxide-semiconductor field-effect transistor (MOSFET). Bipolar output structure allows low on-state voltage drop and large current handling capability, while MOS gate input structure offers high input impedance and fast response speed.

FIG. 1 schematically shows a cross-section of a semi-cell of an IGBT chip having a planar gate structure in the prior art. As shown in FIG. 1, the semi-cell mainly includes: a substrate 101, an N well region 102, a P well region 103, an $N^+$ doped region 104, a $P^+$ doped region 105, a planar gate 106, a gate oxidation layer 107, a passivation layer 108 and a metal layer 109. The IGBT chip having a planar gate structure shown in FIG. 1 has main advantages of simple manufacture processes and low requirements for equipment. Moreover, the planar gate IGBT has good blocking capability and high robustness, so it can be used in places with harsh working environments. However, as MOS channel region is located near wafer surface for planar gate IGBT, the channel density is restricted by the chip surface area, and this results in a weak conductivity modulation effect and a high conduction voltage drop inside the IGBT chip.

FIG. 2 schematically shows a cross-section of a semi-cell of an IGBT chip having a trench gate structure in the prior art. As shown in FIG. 2, the semi-cell mainly includes: a substrate 201, an N well region 202, a P well region 203, an $N^+$ doped region 204, a $P^+$ doped region 205, a trench gate 206, a gate oxidation layer 207, a passivation layer 208 and a metal layer 209. In order to reduce the on-state voltage drop of the IGBT chip, a trench gate structure shown in FIG. 2 is used to replace the planar gate structure. As shown in FIG. 2, the trench gate is formed into the wafer substrate by an etching process, so that the MOS channel is re-arranged from a horizontal direction on the wafer surface to a vertical direction inside the wafer substrate, thereby realizing a one-dimensional current channel and effectively eliminating a JFET effect in the planar gate IGBT. The cell pitch is concurrently reduced notably without the restriction of the chip surface area; therefore, it significantly increases cell density so as to high current density of the chip. However, with increasing the trench gate density, the chip saturation current increases, and weakens its short-circuit performance, so that the chip safe operating area is affected.

FIG. 3 schematically shows a cross-section of a semi-cell of an IGBT chip having a structure including an active trench gate and a dummy trench gate in the prior art. As shown in FIG. 3, the IGBT chip mainly includes: a substrate 301, an N well region 302, a P well region 303, an $N^+$ doped region 304, a $P^+$ doped region 305, a trench gate 306, an accompanying gate 307, a gate oxidation layer 308, a passivation layer 309 and a metal layer 310. In order to balance a trade-off relationship between the short-circuit performance and the current density, the structure of trench gate IGBT with dummy gate(s) shown in FIG. 3 is used to replace the trench gate structure shown in FIG. 2.

The bottoms of trenches in FIG. 2 and FIG. 3 weak the blocking capability of the IGBT chip due to electric field crowding. Therefore, compared to the planar gate IGBT shown in FIG. 1, both trench gate IGBTs with the dummy gate in FIG. 3 and without the dummy gate in FIG. 2 sacrifice a portion of performance of the planar gate, such as, the blocking capability and device robustness, while improving the performance of the IGBT chip.

SUMMARY OF THE INVENTION

To address above technical issues, the present disclosure provides an IGBT chip having a Γ-shape mixed gate structure which combines both a planar gate and a trench gate, including a wafer substrate and a plurality of mixed gate units arranged sequentially on a front surface of the wafer substrate, wherein each of the mixed gate units includes a Γ-shape gate region and two active regions located at both sides of the gate region respectively, wherein the Γ-shape gate region includes:
a trench gate disposed in a trench which is formed by etching downward at a designated position of the gate region;
a planar gate located on a surface of the gate region, wherein the planar gate is connected with the trench gate;
a gate oxidation layer which separates the trench gate and the planar gate from the wafer substrate; and
a passivation layer which covers an external surface of the planar gate; and
wherein the two active regions including a trench gate active region and a planar gate active region are located at both sides of the gate region respectively, wherein both the trench gate active region and the planar gate active region include an N well region, a P well region, a $P^+$ doped region and an $N^+$ doped diffusion sub-region, which are distributed from bottom to top.

In an embodiment, the planar gate and the trench gate are both made of polycrystalline silicon, and the polycrystalline silicon of the planar gate is connected with the polycrystalline silicon of the trench gate.

In an embodiment, the P well region is located at an area at a lower position of the active region to which the P well region belongs and below an edge, which is in contact with the active region to which the P well region belongs, of the planar gate;

the N well region is located below the corresponding P well region and is in contact with the P well region;

$N^+$ doped diffusion sub-region is a portion reserved below the planar gate after an etching is performed to an $N^+$ doped diffusion region which is located above the corresponding P well region and is in contact with the P well region, and the bottom of the $N^+$ doped diffusion sub-region is higher than the surface of the corresponding P well region that is exposed after this etching; and the P+ doped region is located under the surface of the corresponding P well region that is exposed after this etching, and a side portion of the P+ doped region is connected with the corresponding N+ doped diffusion sub-region by diffusion, wherein a side portion of each of the N well region, the P well region and the N+ doped diffusion sub-region in the trench gate active region ends at the gate oxidation layer on a sidewall of the trench gate.

In an embodiment, the mixed gate unit further includes a metal layer which covers the passivation layer, the P+ doped region in the trench gate active region and the P+ doped region in the planar gate active region.

In an embodiment, the P+ doped diffusion sub-region is connected with the metal layer.

In an embodiment, two of the mixed gate units form a cell, wherein the two of the mixed gate units are arranged to be in mirror symmetry.

In an embodiment, the cell has a hexagon cell structure, and multiple cells are distributed in a shape of a honeycomb on the wafer substrate.

In an embodiment, the cell has a square cell structure, and multiple cells are distributed in a shape of a matrix on the wafer substrate.

In an embodiment, the cell has a strip cell structure, and multiple cells are distributed side by side on the wafer substrate.

In an embodiment, the IGBT chip further includes a back structure formed on a back surface of the wafer substrate, wherein the back structure is of a punch-through type, a non-punch-through type or a soft punch-through type.

Compared with the prior art, one or more embodiments of the present disclosure may have the following advantages.

1) In the present disclosure, a planar gate and a trench gate coexist in the same chip, which corresponds to an arrangement that the trench gate is introduced in a weak area of the IGBT chip having a planar gate structure or an arrangement that the planar gate is introduced in the dummy area of the IGBT chip having a trench gate structure, which can adopt respective advantages of the planar gate and the trench gate and avoid respective disadvantages thereof. In this way, the IGBT chip can have a significantly improved chip density, while retaining features of low power consumption and high current density of the trench gate and a feature of a wide safe operating area of the planar gate.

2) In the present disclosure, a MOS channel of the planar gate is distributed on a surface of a wafer substrate, and a MOS channel of the trench gate is perpendicular to the wafer surface and is distributed inside the wafer substrate, polycrystalline silicon of the planar gate and polycrystalline silicon of the trench gate are connected together. The planar gate and the trench gate are connected together and formed as a F-shape mixed gate structure in the present disclosure.

Other features and advantages of the present disclosure will be further explained in the following description, and partially become self-evident therefrom, or be understood through the embodiments of the present disclosure. The objectives and other advantages of the present disclosure will be achieved and obtained through the structure specifically pointed out in the description, claims, and the accompanying drawings.

BRIEF DESCRIPTION OF THE DRAWINGS

The accompanying drawings are used to provide further understanding of the present disclosure and constitute one part of the description. The drawings are used for interpreting the present disclosure together with the embodiments of the present disclosure, not for limiting the present disclosure. In the drawings.

DETAILED DESCRIPTION OF THE EMBODIMENTS

The present disclosure will be explained in detail with reference to the accompanying drawings and the embodiments, whereby it can be fully understood how to solve the technical problem by the technical means according to the present disclosure and achieve the technical effects thereof, and thus the technical solution according to the present disclosure can be implemented. It should be noted that, as long as there is no conflict, the embodiments in the present disclosure and the technical features mentioned in the embodiments may be combined with one another, and the technical solutions obtained all fall within the scope of the present disclosure.

Figure 1:
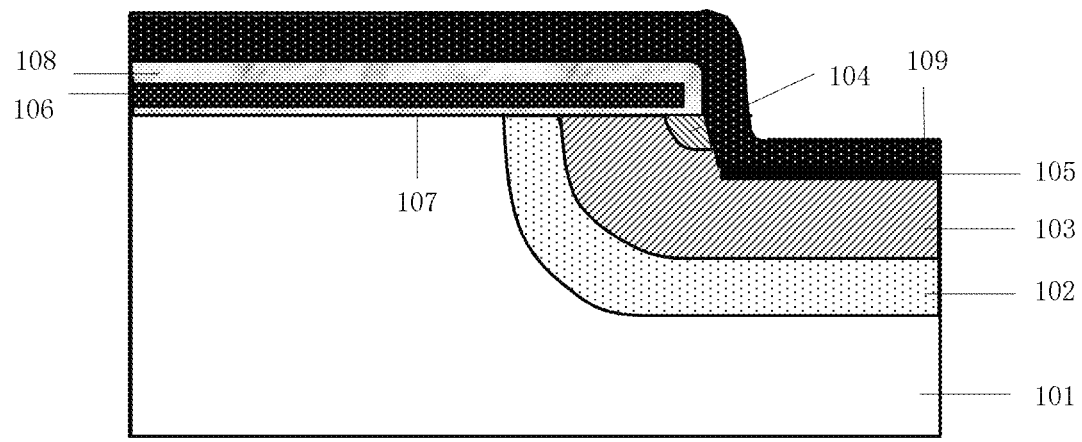
FIG. 1 schematically shows a cross-section of a semi-cell of an IGBT chip having a planar gate structure in the prior art.
Figure 2:
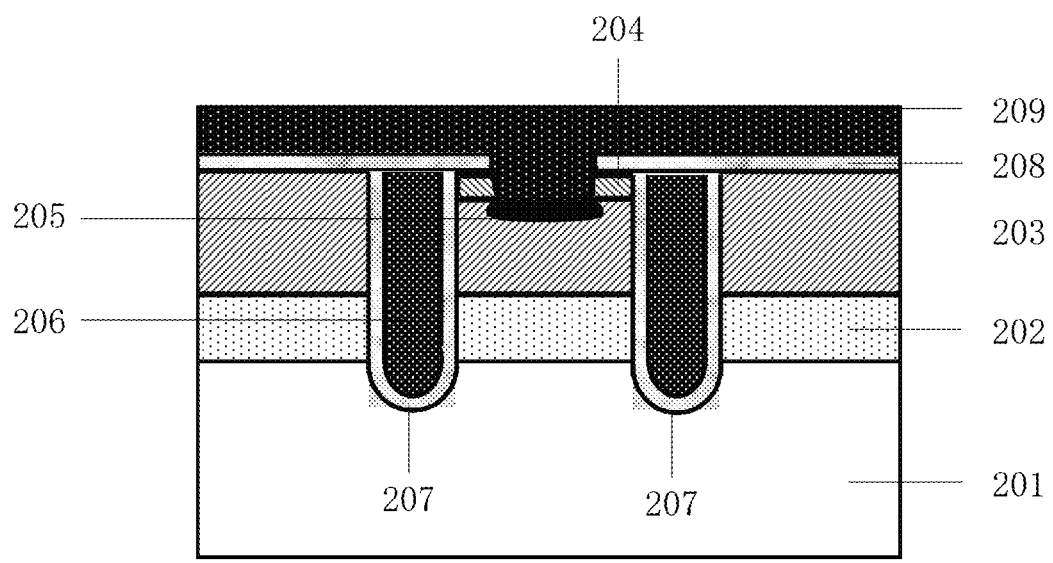
FIG. 2 schematically shows a cross-section of a semi-cell of an IGBT chip having a trench gate structure in the prior art.
Figure 3:
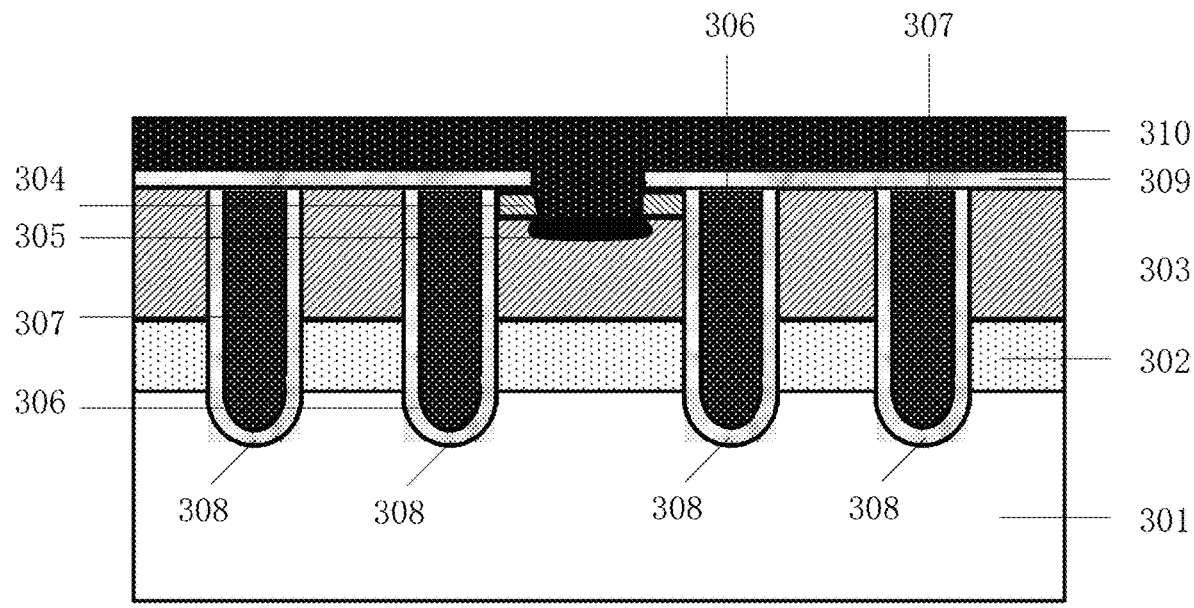
FIG. 3 schematically shows a cross-section of a semi-cell of an IGBT chip having a structure including an active trench gate and a dummy trench gate in the prior art.
Figure 4:
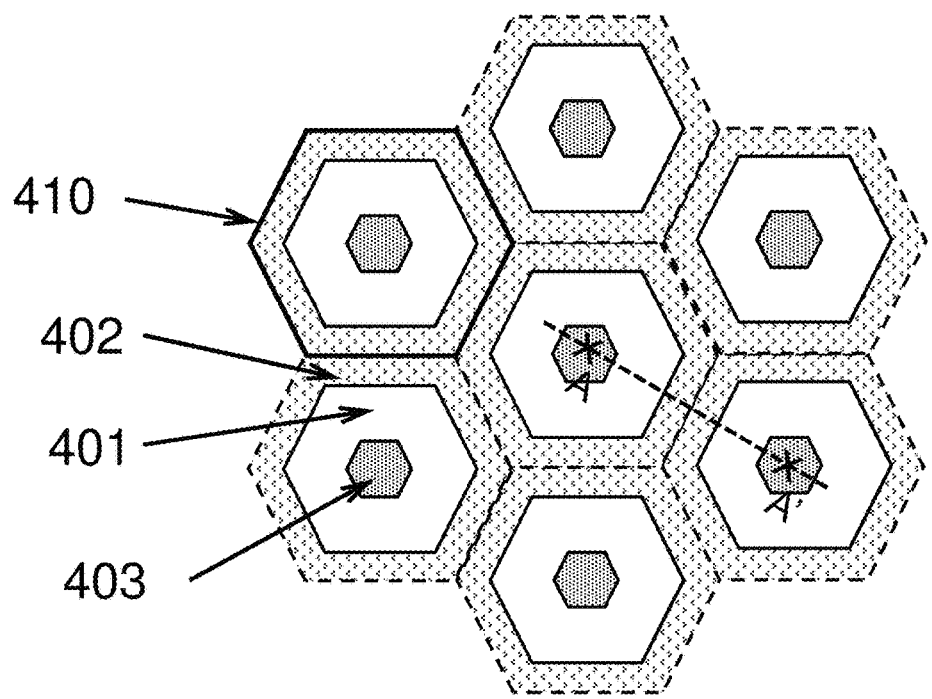
FIG. 4 schematically shows a top view of a hexagon cell of an IGBT chip having a F-shape mixed gate structure according to an embodiment of the present disclosure.

FIG. 4 schematically shows a top view of a hexagon cell of an IGBT chip having a Γ-shape mixed gate structure according to an embodiment of the present disclosure. As shown in FIG. 4, each cell 410 has a hexagon cell structure, and multiple cells are distributed in a shape of a honeycomb on a wafer substrate. Each cell 410 includes a gate region 401, a trench gate active region 402 and a planar gate active region 403, and the trench gate active region 402 and the planar gate active region 403 are located at two sides of the gate region 401 respectively.

In order to illustrate the structure of the IGBT chip shown in FIG. 4 more clearly, a detailed description is given by taking a cross-section in an A-A' direction for a cell of the IGBT chip shown in FIG. 4 as an example.

Figure 5:
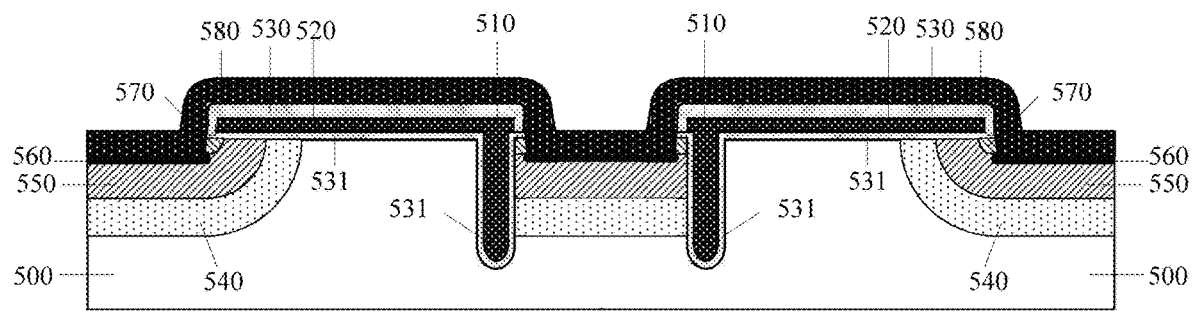
FIG. 5 shows a cross-section in an A-A' direction for a cell of an IGBT chip having a F-shape mixed gate structure according to an embodiment of the present disclosure.

FIG. 5 shows a cross-section in an A-A' direction for a cell of the IGBT chip according to an embodiment of the present disclosure. As shown in FIG. 5, one cell mainly includes two mixed gate units in mirror symmetry. Since the two mixed gate units in FIG. 5 are symmetric, the specific structure of the cell is described below by taking a right mixed gate unit as an example.

As shown in FIG. 5, the mixed gate unit includes a gate region 401, a trench gate active region 402 and a planar gate active region 403, and the trench gate active region 402 and the planar gate active region 403 are located at two sides of the gate region 401 respectively. The gate region 401 includes a trench gate 510, a planar gate 520, a gate oxidation layer 531 and a passivation layer 530. Two active regions include the trench gate active region 402 and the planar gate active region 403, and the trench gate active region 402 and the planar gate active region 403 are formed synchronously by same processing steps. Each of the trench gate active region 402 and the planar gate active region 403 includes an N well region 540, a P well region 550, a $P^+$ doped region 560 and an $N^+$ doped diffusion sub-region 570, which are distributed from bottom to top.

Specifically, the trench gate 510 is located at one side of the gate region 401, and is located in a trench formed by etching downward at a designated position of the gate region 401. The planar gate 520 is located on a surface of the gate region 401. The planar gate 520 is connected with the trench gate 510 and formed as a Γ-shape mixed gate structure.

In a preferred embodiment, the trench gate 510 and the planar gate 520 are formed synchronously by depositing polycrystalline silicon on the surface of the gate region 401. The polycrystalline silicon of the planar gate 520 and the polycrystalline silicon of the trench gate 510 are connected together. A MOS channel of the planar gate 520 is distributed on a surface of a wafer substrate 500, and a MOS channel of the trench gate 510 is perpendicular to the surface of the wafer substrate 500 and is distributed inside the wafer substrate 500. The planar gate 520 and the trench gate 510 jointly serve as a Γ-shape gate of the mixed gate unit.

The gate oxidation layer 531 separates the trench gate 510 and the planar gate 520 from the wafer substrate 500. The passivation layer 530 covers an external surface of the planar gate 520, and is used for effectively separating the planar gate 520 from a metal layer 580 serving as a source. The gate oxidation layer 531 and the passivation layer 530 are formed by different processing steps. The passivation layer 530 has a thickness that is larger than a thickness of the gate oxidation layer 531.

The P well region 550 in the trench gate active region 402 is located at a lower position of the trench gate active region 402 and below an edge, which is in contact with the trench gate active region 402, of the planar gate 520. A side portion of the P well region 550 in the trench gate active region 402 ends at the gate oxidation layer 531 on a sidewall of the trench. The P well region 550 in the planar gate active region 403 is located at a lower position of the planar gate active region 403 and below an edge, which is in contact with the planar gate active region 403, of the planar gate 520. The P well region 550 in the planar gate active region 403 is in contact with the gate oxidation layer 531 below the planar gate 520, and the P well region 550 located below the gate region is in a shape of an arc.

The N well region 540 is located below the corresponding P well region 550 and is in contact with the P well region 550. A side portion of the N well region 540 in the trench gate active region 402 ends at the gate oxidation layer 531 on the sidewall of the trench. The N well region 540 in the planar gate active region 403 encloses the P well region 550, and is in contact with the gate oxidation layer 531 below the planar gate 520.

The $N^+$ doped diffusion sub-region 570 is a portion reserved below the gate region 401 after an etching is performed to an $N^+$ doped diffusion region which is located above the corresponding P well region 550 and is in contact with the P well region 550. The $N^+$ doped diffusion sub-region 570 in the trench gate active region 402 ends at the gate oxidation layer 531 on the sidewall of the trench. The $N^+$ doped diffusion sub-region 570 in the planar gate active region 403 is in contact with the gate oxidation layer 531 below the planar gate 520. Preferably, the bottom of the $N^+$ doped diffusion sub-region 570 is higher than the surface of the P well region 550 that is exposed after this etching. It should be noted that, if it can be ensured that an $N^+$ doped diffusion region under the active source contact region is completely etched through precise process control, the bottom of the $N^+$ doped diffusion sub-region 570 may also be at the same height as the surface of the P well region 550 that is exposed after this etching.

The $P^+$ doped region 560 is located under the surface of the corresponding P well region 550 that is exposed after this etching, and a side portion of the $P^+$ doped region 560 is connected with the corresponding $N^+$ doped diffusion sub-region 570 by diffusion.

It should be noted that, by reasonably arranging the N well region 540, the P well region 550, and a doping dosage and a junction depth of the $N^+$ doped diffusion sub-region 570, a threshold voltage of the channel of the trench gate 510 and a threshold voltage of the channel of the planar gate 520 can be the same, so that the MOS channel of the trench gate 510 and the MOS channel of the planar gate 520 are enabled to be turned on or turned off synchronously. In the present embodiment, a dosage of N-type impurities implanted into the N well region 540 is smaller than a dosage of the N-type impurities diffused into $N^+$ doped diffusion sub-region 570. A dosage of P-type impurities implanted into the P well region 550 is smaller than a dosage of the P-type impurities implanted into the $P^+$ doped region 560.

Preferably, the mixed gate unit further includes a metal layer 580 which covers the passivation layer 530, the $P^+$ doped region 560 in the trench gate active region 402 and the $P^+$ doped region 560 in the planar gate active region 403. The $N^+$ doped diffusion region 570 is in contact with the metal layer 580. Alternatively, another film layer structure may further be included between an upper surface of the passivation layer 530 in the gate region and the metal layer 580, and specific limitation is not made herein. In the present embodiment, the $P^+$ doped region 560 in the active region is covered by the metal layer 580, and an ohmic contact is formed between the $P^+$ doped region 560 and the metal layer 580 by high temperature annealing (400° C. to 450° C.).

It should be noted that a back surface of the wafer substrate 500 may has a structure of a punch-through type, a non-punch-through type or a soft punch-through type.

Figure 6:
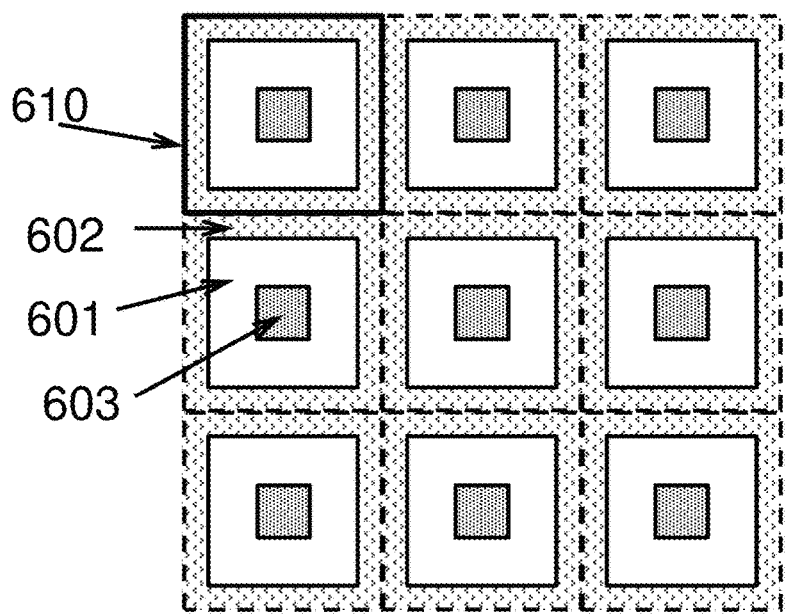
FIG. 6 schematically shows a top view of a square cell of an IGBT chip having a F-shape mixed gate structure according to an embodiment of the present disclosure.
Figure 7:
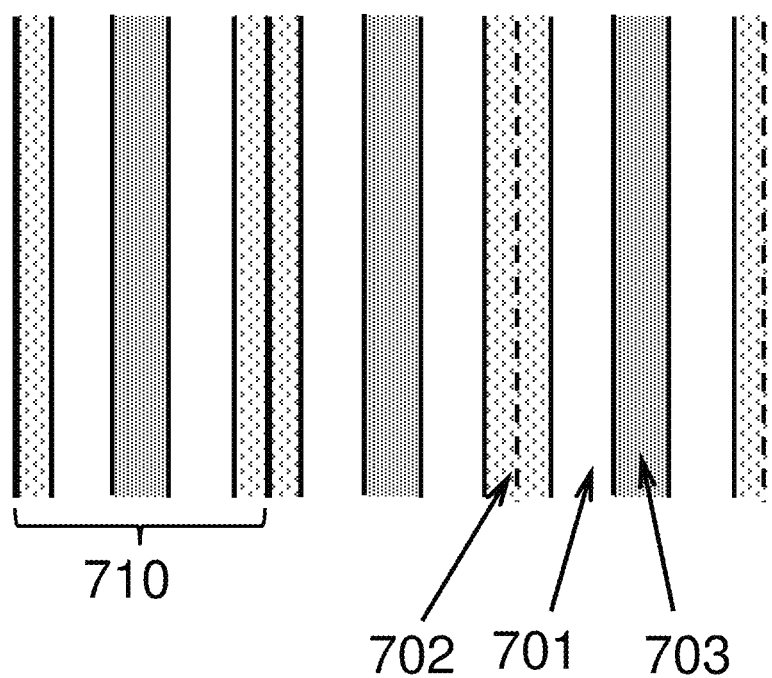
FIG. 7 schematically shows a top view of a strip cell of an IGBT chip having a F-shape mixed gate structure according to an embodiment of the present disclosure.

Alternatively, a first embodiment of the present disclosure may also be realized by using a square cell structure shown in FIG. 6 or a strip cell structure shown in FIG. 7, so as to make the planer gate and the trench gate coexist in the same chip. Specifically, as shown in FIG. 6, each cell 610 has a square cell structure, and multiple cells 610 are arranged in a shape of a matrix on the wafer substrate. Each cell 610 includes a gate region 601, a trench gate active region 602 and a planar gate active region 603, and the trench gate active region 602 and the planar gate active region 603 are located at two sides of the gate region 601. As shown in FIG. 7, each cell 710 has a strip cell structure, and multiple cells 710 are arranged on the wafer substrate side by side. Each cell 710 includes a gate region 701, a trench gate active region 702 and a planar gate active region 703, and the trench gate active region 702 and the planar gate active region 703 are located at two sides of the gate region 701.

In the present embodiment, the planar gate and the trench gate coexist in the same chip, which corresponds to an arrangement that the trench gate is introduced in a weak area of the IGBT chip having a planar gate structure or an arrangement that the planar gate is introduced in the dummy area of the IGBT chip having a trench gate structure, which can adopt respective advantages of the planar gate and the trench gate and avoid respective disadvantages thereof. In this way, the IGBT chip can have a significantly improved chip density, while retaining features of low power consumption and high current density of the trench gate structure and a feature of a wide safe operating area of the planar gate structure.

Although the embodiments of the present disclosure are disclosed as above, the above embodiments are described only for better understanding, rather than restricting, the present disclosure. Any person skilled in the art can make any amendment or change to the implementing forms or details without departing from the spirit and scope of the present disclosure. The protection scope of the present disclosure shall be determined by the scope as defined in the claims.

The invention claimed is:

1. An IGBT chip having a Γ-shape mixed gate structure, comprising:
   a wafer substrate and a plurality of mixed gate units arranged sequentially which are formed on a front surface of the wafer substrate, wherein each of the mixed gate units comprises a gate region and two active regions located at two sides of the gate region,
   wherein the gate region comprises:
      a trench gate disposed in a trench which is formed by etching downward at a designated position of the gate region;
      a planar gate located on a surface of the gate region, wherein the planar gate is physically and directly connected with the trench gate in one and the same gate region;
      a gate oxidation layer which separates the trench gate and the planar gate from the wafer substrate; and
      a passivation layer which covers an external surface of the planar gate; and
   wherein the two active regions comprise two different active regions which are a trench gate active region and a planar gate active region, and the trench gate active region and the planar active region are located at the two sides of the gate region respectively,
   wherein each of the trench gate active region and the planar gate active region comprises an N well region, a P well region, a P$^+$ doped region and an N$^+$ doped diffusion sub-region, which are distributed from bottom to top,
   wherein the P well region is located at an area at a lower position of the active region to which the P well region belongs;
   the N well region is located below the corresponding P well region and is in contact with the P well region;
   the N$^+$ doped diffusion sub-region is a portion reserved below the planar gate after an etching is performed to an N$^+$ doped diffusion region which is located above the corresponding P well region and is in contact with the P well region, and the bottom of the N$^+$ doped diffusion sub-region is higher than a surface of the corresponding P well region that is exposed after the etching; and
   the P$^+$ doped region is located under the surface of the corresponding P well region that is exposed after the etching, and a side portion of the P$^+$ doped region is connected with the corresponding N+ doped diffusion sub-region by diffusion,
   wherein a side portion of each of the N well region, the P well region and the N$^+$ doped diffusion sub-region in the trench gate active region ends at the gate oxidation layer on a sidewall of the trench gate;
   wherein each of the P well region in the trench gate active region is disposed between a first trench in which the trench gate of one of the plurality of mixed gate units is disposed and a second trench in which the trench gate of another one of the plurality of mixed gate units is disposed, the P well region in the trench gate active region extends continuously from a sidewall of the first trench to a sidewall of the second trench, such that the first side portion of the P well region in the trench gate active region directly contacts the sidewall of the first trench and a second side portion of the P well region in the trench gate active region directly contacts the sidewall of the second trench; and
   wherein the N well region in the planar gate active region directly contacts the gate oxidation layer under the planar gate at the front surface of the wafer substrate.

2. The IGBT chip according to claim 1, wherein the planar gate and the trench gate are both made of polycrystalline silicon, and the polycrystalline silicon of the planar gate is connected with the polycrystalline silicon of the trench gate and formed a Γ-shape mixed gate structure.

3. The IGBT chip according to claim 1, wherein the mixed gate unit further comprises a metal layer which covers the passivation layer, the P$^+$ doped region in the trench gate active region and the P$^+$ doped region in the planar gate active region.

4. The IGBT chip according to claim 3, wherein the N$^+$ doped diffusion sub-region is connected with the metal layer.

5. The IGBT chip according to claim 1, wherein the IGBT chip further comprises a back structure formed on a back surface of the wafer substrate, wherein the back structure is of a punch-through type, a non-punch-through type or a soft punch-through type.

6. The IGBT chip according to claim 1, wherein two of the mixed gate units form a cell, wherein the two of the mixed gate units are arranged to be in mirror symmetry.

7. The IGBT chip according to claim 6, wherein the cell has a hexagon cell structure, and multiple cells are distributed in a shape of a honeycomb on the wafer substrate.

8. The IGBT chip according to claim 7, wherein the IGBT chip further comprises a back structure formed on a back surface of the wafer substrate, wherein the back structure is of a punch-through type, a non-punch-through type or a soft punch-through type.

9. The IGBT chip according to claim 6, wherein the cell has a square cell structure, and multiple cells are distributed in a shape of a matrix on the wafer substrate.

10. The IGBT chip according to claim 9, wherein the IGBT chip further comprises a back structure formed on a back surface of the wafer substrate, wherein the back structure is of a punch-through type, a non-punch-through type or a soft punch-through type.

11. The IGBT chip according to claim 6, wherein the cell has a strip cell structure, and multiple cells are distributed side by side on the wafer substrate.

12. The IGBT chip according to claim 11, wherein the IGBT chip further comprises a back structure formed on a back surface of the wafer substrate, wherein the back structure is of a punch-through type, a non-punch-through type or a soft punch-through type.

* * * * *